United States Patent [19]

Schenck

[11] Patent Number: 5,066,872

[45] Date of Patent: Nov. 19, 1991

[54] SPEED-UP TECHNIQUE FOR A CONSTANT DI/DT BUFFER

[75] Inventor: Stephen R. Schenck, McKinney, Tex.

[73] Assignee: Texas Instruments Incorporated, Dallas, Tex.

[21] Appl. No.: 535,815

[22] Filed: Jun. 11, 1990

[51] Int. Cl.[5] ............................................. H03K 17/16
[52] U.S. Cl. .................................... 307/443; 307/263; 307/542
[58] Field of Search ............... 307/443, 446, 451, 475, 307/481, 542, 263

[56] References Cited

U.S. PATENT DOCUMENTS

| | | | |
|---|---|---|---|
| 4,820,942 | 4/1989 | Chan | 307/542 |
| 4,823,029 | 4/1989 | Gabara | 307/542 X |
| 4,959,561 | 9/1990 | McDermott et al. | 307/443 |
| 4,972,101 | 11/1990 | Panotori et al. | 307/443 |
| 4,975,598 | 12/1990 | Borkar | 307/443 |
| 4,987,324 | 1/1991 | Wong et al. | 307/451 |
| 4,992,677 | 2/1991 | Ishibashi et al. | 307/542 X |
| 5,003,205 | 3/1991 | Kohda et al. | 307/475 |
| 5,008,568 | 4/1991 | Leung et al. | 307/263 X |
| 5,010,256 | 4/1991 | Dicke | 307/263 |
| 5,013,940 | 5/1991 | Ansel | 307/263 X |

Primary Examiner—David Hudspeth
Attorney, Agent, or Firm—B. Peter Barndt; James T. Comfort; Melvin Sharp

[57] ABSTRACT

The disclosure relates to a circuit and method of reducing inductive voltage spikes caused by an abrupt change in current by an output transistor, by providing an input node for receiving an input voltage signal, providing an output node, providing a first transistor coupled to the output node, receiving a predetermined voltage at the input node, controlling voltage control circuitry coupled between the input node and the first transistor and responsive to the predetermined voltage at the input node to control the voltage driving the first transistor with respect to time to provide a constant rate of change of current with respect to time in the first transistor and providing a second transistor coupled to the output node in parallel with the first transistor which turns on prior to the first transistor.

20 Claims, 2 Drawing Sheets

5,066,872

SPEED-UP TECHNIQUE FOR A CONSTANT DI/DT BUFFER

CROSS REFERENCE TO RELATED APPLICATIONS

This application is an improvement of application Ser. No. 07/213,002, filed June 29, 1988 now U.S. Pat. No. 4,924,120 of Stephen R. Schenck for Low Noise Output Circuit, the contents of which are incorporated herein by reference.

BACKGROUND OF THE INVENTION

1. Field of the Invention

This invention relates to a speed-up technique for a constant di/dt buffer.

2. Brief Description of the Prior Art

Advances in the field of integrated circuit technology have materially increased the speed at which the output of a circuit reacts in response to an input thereto. Such increased speed of operation has resulted in abrupt transitions of the circuit output current.

Though faster circuits are of great value in the art, the abrupt transitions of the output current create inductance problems. This problem is due to the fact that the circuit leads have a small inductance associated therewith and, since voltage is related to the time rate of change of current, these abrupt current transitions create large changes of current at the ground and power supply leads and in the bonding wire, resulting in ground and power supply voltage spikes. These voltage spikes affect the voltages of the devices and cause output ringing, ground bounce and false signals.

In the above noted pending application the above described problems are reduced by causing the voltage from gate to source of an MOS transistor (VGS) minus the transition voltage of the transistor (VT) to vary proportionally to the square root of time in order to achieve a constant di/dt during the turn-on of the MOS transistor. However, this square root of time function is provided after VGS becomes larger than VT, and VGS often does not reach the VT voltage level in a reasonable amount of time, thereby preventing the output from commencing switching until about 2.5 nanoseconds after the input has changed under good operating conditions of strong models, low temperature and high supply voltage. Under poor conditions, the commencement of switching results after about a 7 nanosecond delay or "wait" time, thereby resulting in excessive and unwanted delay before anything happens at the output.

The theory of operation is that, if the current to the circuit output is changed at a constant rate (i.e., di/dt is made a constant), the response obtained is a voltage across the inductance in the package containing the circuit. This voltage across the inductance increases to some value and then stays at that value for a certain time. While the above described circuit operates satisfactorily for the purpose intended, it is apparent that the "wait" time should be decreased and preferably approach theoretical minimum di/dt controlled propagation delay for the ground inductance used.

SUMMARY OF THE INVENTION

In accordance with the present invention, there is provided a circuit which maintains the di/dt performance of the above noted circuit but without the delay or "wait" time. The circuit in accordance with the present invention approaches the theoretical minimum di/dt controlled propagation delay for the ground inductance used.

Briefly, the above improvement is accomplished in accordance with the present invention by utilizing the circuitry of the above noted application and adding, essentially in parallel therewith, circuitry so that initially a very fast pulse of current is generated at the time of receipt of the input signal. This results in a circuit wherein the initial pulse is designed to be of a size which is reasonable for the type of inductance present followed by a di/dt controlled circuit which provides an additive current thereto but which is slower because it operates more in the manner of an analog circuit. Therefore the di/dt controlled circuit is a digital circuit which starts with the output voltage changing rapidly initially followed by an analog circuit output which is additive thereto and in combination provides the desired output with minimum delay.

More specifically, the circuit in accordance with the present invention includes upper and lower circuit portions which are mirror images of each other or symmetrical in that P-channel transistors in the lower circuit are N-channel in the upper circuit and vice versa. One of the upper and lower circuits is generally on when the other circuit is off. The on and off condition is based upon the voltage level of the input signal. The input signal turns on a pair of transistors in one of the circuit portions (the other circuit portion being turned off), one of these transistors causing a first transistor acting as an inverter in the turned on circuit portion to turn on immediately whereas the other of the transistors causes a second transistor to turn on after the above described "wait" period. The combination or sum of currents provided by the first and second transistors results in the controlled output described in the above noted copending application, but without the "wait" period.

DESCRIPTION OF THE PREFERRED EMBODIMENT

Figure 1:
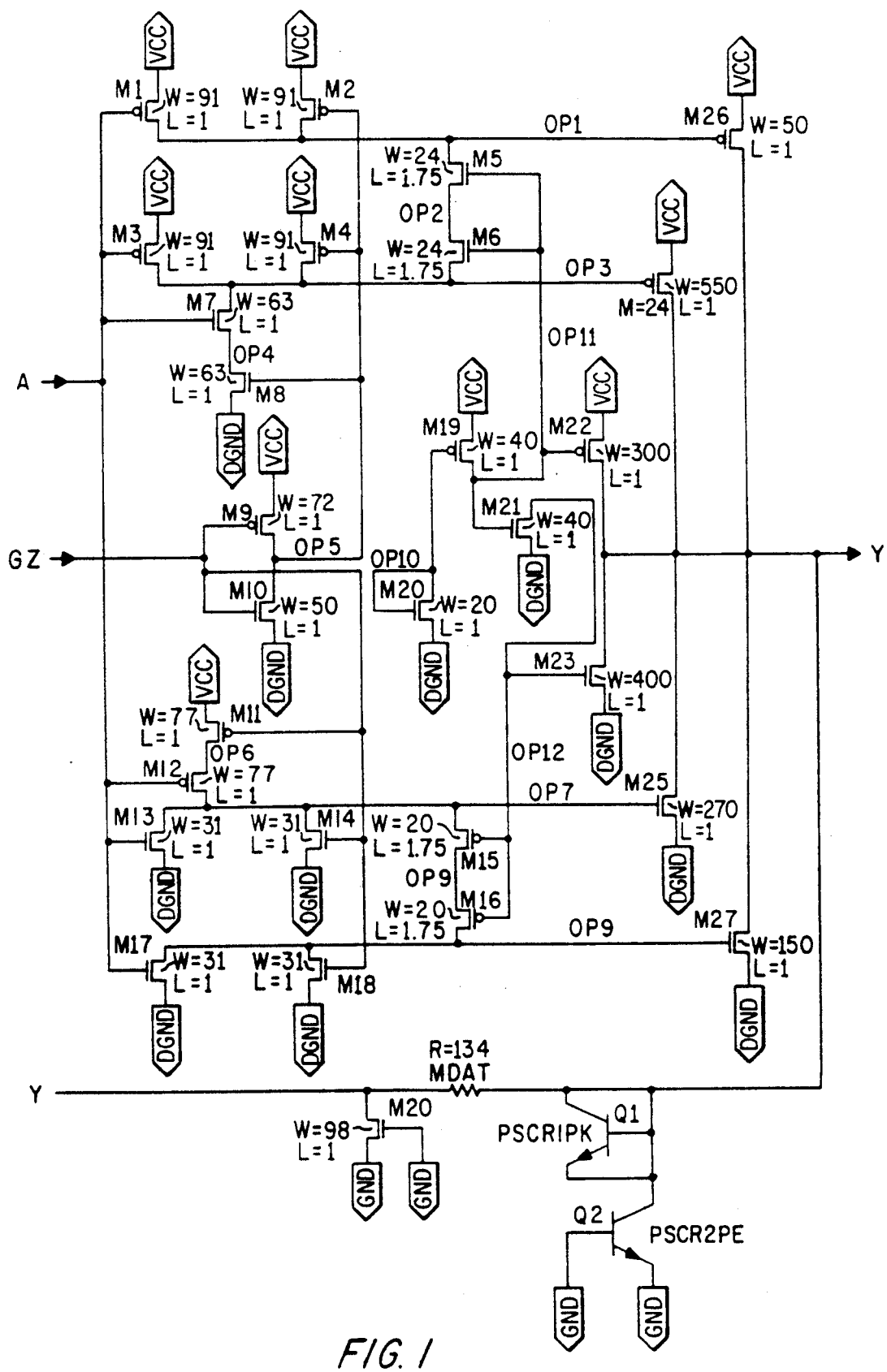
FIG. 1 is a circuit diagram of a preferred embodiment of the invention.

Referring now to FIG. 1, there is shown a circuit diagram in accordance with a preferred embodiment of the invention wherein A is the input and Y is the output and P-channel transistor M12 and N-channel transistor M13 drive N-channel transistor M25 which is an inverter which is not present in the above noted pending application. P-channel transistor M11 is tied to the GZ pin which activates or deactivates the output Y. The GZ input and the circuitry associated therewith forms no part of the invention herein and will be assumed to maintain the transistors M8 and M11 in the on state.

Assuming transistor M11 is turned on, transistors M12 and M11 bias the gate of inverter transistor M25 to turn on inverter transistor M25. P-channel transistors M15 and M16 bias the gate of N-channel transistor M27 to turn on transistor M27. Transistors M15 and M16 are permanently turned on by transistor M21. Transistors M25 and M27 have different widths, the wider transistor operating more rapidly than the thinner transistor. Therefore transistor M25, which has a width of 270 micrometers is turned on substantially immediately followed later by transistor M27 which has a width of 150 micrometers. The ratio of widths of transistors M25 to M27 can be varied, however it is essential that transistor M25, which is turned on initially, be sized so that the amount of di/dt is a certain amount when the transistor M25 is turned on and the excess current therebeyond is handled by another transistor which is di/dt controlled, namely transistor M27.

The transistors in the upper circuit portion of FIG. 1 act in the same manner as those discussed above but are P-channel where the equivalent transistor in the lower circuit portion is N-channel and vice versa. Accordingly, when the lower circuit portion is on, the upper circuit portion is off and vice versa. In other words, transistor M3 is the P-channel equivalent of N-channel transistor M13 and transistor M7 is the N-channel equivalent of P-channel transistor M12 which drive the pull up P-channel transistors M24 and M26 which perform the same function as the equivalent N-channel transistors M25 and M27 but for pulling in the opposite direction. It is also noted that transistor M24 has a width of 550 micrometers and transistor M26 has a width of 50 micrometers. The dimensions of the P-channel transistors M24–26 are different from those of N-channel transistors M25–27 because P-channel transistors naturally generate less di/dt than N-channel transistors. Therefore a larger transistor can be used. Also, the Vcc di/dt is permitted to be above ground di/dt in some circumstances.

The above described schematic diagram can be the same for different inductances which may be encountered with only the transistor dimensions changed to conform to the inductance value involved.

In operation, an input signal is provided at the input terminal A and turns on the outputs Y in the following manner. Assuming the voltage at the input A to be low, transistor M13 is turned off and transistor M12 is turned on. Since transistor M11 is already on (because GZ is assumed to be low), transistor M12 charges up the gate on transistor M25 rapidly to turn transistor M25 on. Current also goes through transistors M15 and M16 to charge up the gate of transistor M27 in a controlled fashion proportional to the square root of time t so that transistor M27 turns on slightly later than does transistor M25. When transistors M25 and M27 turn on, they draw current from the output Y to ground. The di/dt controlled output from transistor M27 (M26 in the upper circuit) is added to a fast output from transistor M25 (M24 in the upper circuit) with the fast output sized so that it does not contribute an excessive amount of di/dt voltage on the ground pins for the circuit but speeds up the output. There is usually a dead spot of 1 or 2 nanoseconds or more using the prior art circuit as noted above. Here the circuit turns on as fast as an ordinary output circuit that does not have di/dt control. It can therefore be seen that transistor M25 is a new element that has been added to the above noted prior art circuit to provide fast response whereby, when the circuit is turned on, transistor M25 goes on rapidly and then current builds up through transistors M15 and M16 to turn on transistor M27 with the outputs of transistors M25 and M27 being additive at output Y.

The difference from the prior art circuit noted above is that transistors M15 and M16 are very similar to elements of the above noted application in that series devices create a voltage that changes with time in a certain fashion. The difference herein is providing a "kick start" and providing a circuit which is di/dt controlled and operates as rapidly as a circuit which is not di/dt controlled, at least in terms of turning on initially.

As stated above, the upper circuit portion operates in the same manner as the lower circuit portion except that it requires an input voltage at input A of opposite polarity or type (high as opposed to low).

The reason for using both transistors M25 and M27 rather than transistor M25 alone is that more voltage would be required on the ground pin if transistor M25 alone were used and the idea of the circuit is to provide a certain level of ground voltage for a given amount of inductance. This is done so that the peak voltage is minimized with concomitant maintenance of high speed.

N-channel transistor M17 insures that transistor M27 is turned off when the voltage at input A is high and N-channel transistor M18 insures that transistor M27 is turned off when GZ is high. When GZ is high, none of transistors M24, M25, M26 or M27 are on.

P-channel transistor M19 and N-channel transistors M20 and M21 are a tie off cell whereby a gate is never tied to ground or Vcc to avoid application of an undesired high voltage to the gate. These elements form no part of the invention herein.

Figure 2:
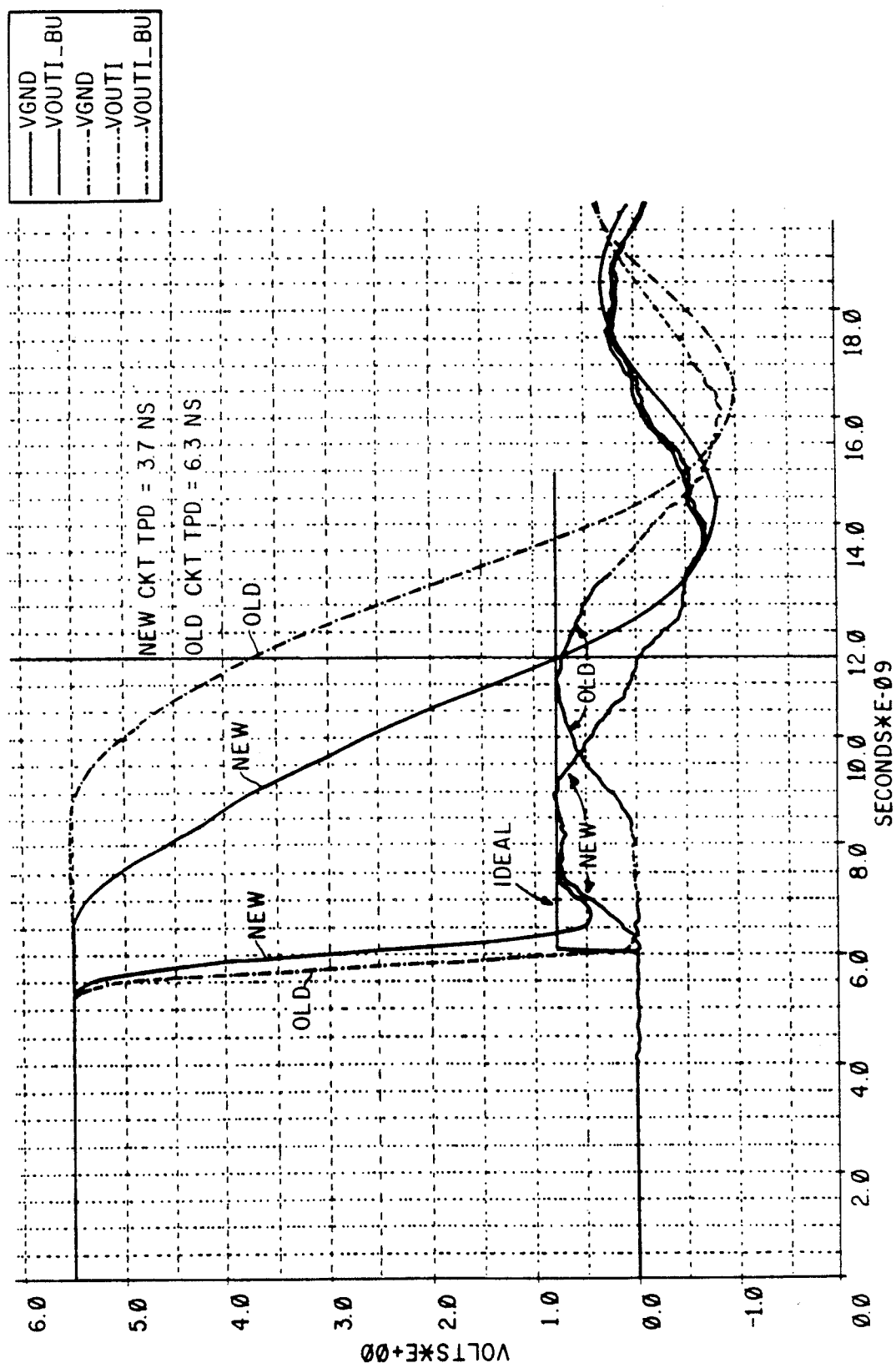
FIG. 2 is a graph of the voltage vs. time relationship for the circuit of the above noted pending application and the circuit of the present invention.

FIG. 2 shows the voltage vs. time relationship for the circuit of the above noted copending application (OLD) and that of the present invention (NEW). Note that the GND voltage for the NEW circuit quickly increases to 0.8 volt and remains there for over 2 nanoseconds while the output starts to go low. The GND voltage for the OLD circuit begins to increase almost 2.5 nanoseconds after the NEW version, resulting in a 2.5 nanosecond improvement for the NEW circuit. The ideal ground voltage vs. time is shown as an increase to 0.8 volts which is maintained until the output has switched.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:
1. An electronic circuit which comprises:
   (a) an input node for receiving an input voltage signal;
   (b) an output node;
   (c) a first transistor coupled to said output node;
   (d) voltage control circuitry coupled between said input node and said first transistor and responsive to predetermined voltage at said input node to control the voltage driving said first transistor with respect to time to provide a constant rate of change of current with respect to time in said first transistor; and
   (e) a second transistor coupled to said output node and responsive to said predetermined voltage at said input node to turn on prior to said first transistor.

2. A circuit as set forth in claim 1 wherein said first transistor has a greater width than said second transistor.

3. A circuit as set forth in claim 1 wherein said first and second transistors are both N-channel.

4. A circuit as set forth in claim 1 wherein said first and second transistors are both P-channel.

5. A circuit as set forth in claim 2 wherein said first and second transistors are both P-channel.

6. A circuit as set forth in claim 2 wherein said first and second transistors are both N-channel.

7. A circuit as set forth in claim 1 wherein said first and second transistors are connected in parallel.

8. A circuit as set forth in claim 2 wherein said first and second transistors are connected in parallel.

9. A circuit as set forth in claim 3 wherein said first and second transistors are connected in parallel.

10. A circuit as set forth in claim 4 wherein said first and second transistors are connected in parallel.

11. A circuit as set forth in claim 5 wherein said first and second transistors are connected in parallel.

12. A circuit as set forth in claim 6 wherein said first and second transistors are connected in parallel.

13. An electronic circuit which comprises:
    (a) an input node for receiving an input voltage signal;
    (b) an output node;
    (c) a first transistor coupled to said output node;
    (d) voltage control circuitry coupled between said input node and said first transistor and responsive to predetermined voltage at said input node to control the voltage driving said first transistor with respect to time to provide a constant rate of change of current with respect to time through said first transistor; and
    (e) a second transistor coupled to said output node and responsive to said voltage at said input node to turn on prior to said first transistor.

14. A circuit as set forth in claim 13 wherein said second transistor has a greater width than said first transistor.

15. A circuit as set forth in claim 13 wherein said first and second transistors are both N-channel.

16. A circuit as set forth in claim 13 wherein said first and second transistors are both P-channel.

17. A circuit as set forth in claim 14 wherein said first and second transistors are both P-channel.

18. A circuit as set forth in claim 14 wherein said first and second transistors are both N-channel.

19. A method of reducing inductive voltage spikes caused by an abrupt change in current by an output transistor, comprising the steps of:
    (a) providing an input node for receiving an input voltage signal;
    (b) providing an output node;
    (c) providing a first transistor coupled to said output node;
    (d) receiving a predetermined voltage at said input node;
    (e) controlling voltage control circuitry coupled between said input node and said first transistor in responsive to said predetermined voltage at said input node to control the voltage driving said first transistor with respect to time to provide a constant rate of change of current with respect to time in said first transistor; and
    (e) providing a second transistor coupled to said output node in parallel with said first transistor responsive to said voltage at said input node to turn on prior to said first transistor.

20. A method of reducing inductive voltage spikes caused by an abrupt change in current by an output transistor, comprising the steps of:
    (a) providing an input node for receiving an input voltage signal;
    (b) providing an output node;
    (c) providing a first transistor coupled to said output node;
    (d) receiving a predetermined voltage at said input node;
    (e) providing controlling voltage control circuitry coupled between said input node and said first transistor and responsive to said predetermined voltage at said input node to control the voltage driving said first transistor with respect to time to provide a constant rate of change of current with respect to time in said first transistor; and
    (e) providing a second transistor coupled to said output node and responsive to said input voltage to turn on prior to said first transistor.

* * * * *